(12) United States Patent
Tatematsu et al.

(10) Patent No.: US 12,348,210 B2
(45) Date of Patent: Jul. 1, 2025

(54) MULTILAYER FILTER

(71) Applicant: TDK CORPORATION, Tokyo (JP)

(72) Inventors: Masahiro Tatematsu, Tokyo (JP); Yuta Ashida, Tokyo (JP); Shuhei Sawaguchi, Tokyo (JP); Keigo Shibuya, Tokyo (JP); Tomonori Terui, Tokyo (JP); Tetsuzo Goto, Tokyo (JP)

(73) Assignee: TDK CORPORATION, Tokyo (JP)

( * ) Notice: Subject to any disclaimer, the term of this patent is extended or adjusted under 35 U.S.C. 154(b) by 182 days.

(21) Appl. No.: 18/456,835

(22) Filed: Aug. 28, 2023

(65) Prior Publication Data

US 2024/0072754 A1  Feb. 29, 2024

(30) Foreign Application Priority Data

Aug. 29, 2022  (JP) .................................. 2022-135775

(51) Int. Cl.
*H03H 7/01* (2006.01)
*H03H 1/00* (2006.01)

(52) U.S. Cl.
CPC ........ *H03H 7/1775* (2013.01); *H03H 7/0115* (2013.01); *H03H 2001/0085* (2013.01)

(58) Field of Classification Search
CPC .......... H03H 7/00; H03H 7/01; H03H 7/0115; H03H 7/0161; H03H 7/1725; H03H 7/1758; H03H 7/1775; H03H 7/1766; H03H 7/1783; H03H 7/1791; H03H 7/17; H03H 2001/0085; H03H 9/0561; H03H 9/131

USPC ................ 333/167, 181, 182, 183, 184, 185
See application file for complete search history.

(56) References Cited

U.S. PATENT DOCUMENTS

| | | | |
|---|---|---|---|
| 11,356,073 B2* | 6/2022 | Sato | ..................... H03H 7/0115 |
| 12,034,426 B2* | 7/2024 | Ogawa | ................. H03H 7/0115 |
| 12,267,057 B2* | 4/2025 | Nakatsutsumi | ......... H01F 27/32 |
| 2021/0344320 A1 | 11/2021 | Sawaguchi et al. | |
| 2021/0391842 A1 | 12/2021 | Choi et al. | |
| 2022/0416754 A1 | 12/2022 | Sawaguchi et al. | |
| 2023/0077950 A1 | 3/2023 | Sato et al. | |

FOREIGN PATENT DOCUMENTS

| | | |
|---|---|---|
| JP | 2021-175151 A | 11/2021 |
| WO | 2022004257 A1 | 1/2022 |

* cited by examiner

*Primary Examiner* — Hai L Nguyen
(74) *Attorney, Agent, or Firm* — Oliff PLC

(57) ABSTRACT

In a multilayer filter, first and second resonant circuits are arranged in a direction crossing a stacking direction of a plurality of dielectric layers. An input/output portion includes an input/output port group including an unbalanced port and a pair of balanced ports or an input/output port group including two pairs of balanced ports. The second resonant circuit includes an inductor conductor, a first capacitor conductor, and a second capacitor conductor. The inductor conductor includes first and second ends. The first capacitor conductor is connected to the first end. The second capacitor conductor is connected to the second end. The second dielectric layer has a dielectric constant lower than that of the first dielectric layer. The first and second capacitor conductors are provided in the first dielectric layer. At least a part of the inductor conductor is provided in the second dielectric layer.

10 Claims, 8 Drawing Sheets

MULTILAYER FILTER

BACKGROUND OF THE INVENTION

1. Field of the Invention

The present invention relates to a multilayer filter.

2. Description of Related Art

A multilayer filter including a multilayer body and a conductor unit is known (for example, Patent Literature 1). In the multilayer body, a plurality of dielectric layers are stacked. The conductor unit is provided inside the multilayer body. The conductor unit includes an input/output portion and a pair of resonant circuits. The input/output portion includes an input/output port group including a plurality of ports. In the example illustrated in Japanese Unexamined Patent Publication No. 2021-175151, the input/output portion includes an unbalanced port and a balanced port.

SUMMARY OF THE INVENTION

A balanced multilayer filter is used, for example, when processing a balanced signal. The balanced multilayer filter includes a balanced-balanced filter as well as an unbalanced-balanced filter such as the above-described multilayer filter. In the balanced multilayer filter, it is required to reduce spurious in a desired frequency range.

It is an object of one aspect of the present invention to provide a multilayer filter capable of reducing spurious in a desired frequency range.

A multilayer filter according to one aspect of the present invention includes a multilayer body and a conductor unit. In the multilayer body, a plurality of dielectric layers are stacked. The conductor unit is provided inside the multilayer body. The conductor unit includes an input/output portion and first and second resonant circuits. The first and second resonant circuits are arranged in a direction crossing a stacking direction of the plurality of dielectric layers. The first and second resonant circuits are connected to the input/output portion. The input/output portion includes an input/output port group including an unbalanced port and a pair of balanced ports or an input/output port group including two pairs of balanced ports. The second resonant circuit includes an inductor conductor, a first capacitor conductor, and a second capacitor conductor. The inductor conductor has first and second ends. The first capacitor conductor is connected to the first end. The second capacitor conductor is connected to the second end. The plurality of dielectric layers include a first dielectric layer and a second dielectric layer. The second dielectric layer has a dielectric constant lower than that of the first dielectric layer. The first and second capacitor conductors are provided in the first dielectric layer. At least a part of the inductor conductor is provided in the second dielectric layer.

In this multilayer filter, the input/output portion includes an input/output port group including an unbalanced port and a pair of balanced ports or an input/output port group including two pairs of balanced ports. The plurality of dielectric layers include the first dielectric layer and the second dielectric layer. The second dielectric layer has a dielectric constant lower than that of the first dielectric layer. The first and second capacitor conductors are provided in the first dielectric layer. At least a part of the inductor conductor is provided in the second dielectric layer. According to this configuration, a frequency range in which spurious occurs can be adjusted, and spurious in a desired frequency range can be reduced. Since the capacitor conductors are provided in the first dielectric layer, the size of the capacitor can be reduced compared with a case where all the capacitor conductors are provided in the second dielectric layer. Therefore, spurious in a desired frequency range can be reduced while suppressing an increase in the size of the multilayer filter.

In the one aspect described above, the first resonant circuit may include an inductor conductor and a third capacitor conductor. The inductor conductor of the first resonant circuit may have third and fourth ends. The third capacitor conductor may be connected to the third end. The fourth end may be grounded. In this case, in the multilayer filter having unbalanced-balanced characteristics, high-frequency spurious can be reduced.

In the one aspect described above, the third capacitor conductor may be provided in the first dielectric layer. In this case, desired spurious can be adjusted more easily.

In the one aspect described above, the first resonant circuit may include an inductor conductor, a third capacitor conductor, and a fourth capacitor conductor. The inductor conductor may have third and fourth ends. The third capacitor conductor may be connected to the third end. The fourth capacitor conductor may be connected to the fourth end. In this case, in the multilayer filter having balanced-balanced characteristics, high-frequency spurious can be reduced.

In the one aspect described above, the third capacitor conductor and the fourth capacitor conductor may be provided in the first dielectric layer. In this case, desired spurious can be adjusted more easily.

In the one aspect described above, the first resonant circuit and the second resonant circuit may have configurations mirror-symmetrical to each other. In this case, it is possible to realize a multilayer filter in which variations are suppressed and a desired impedance is secured.

In the one aspect described above, the inductor conductor may include a conductor layer and a plurality of vias. The conductor layer may extend in a direction crossing the stacking direction. The plurality of vias may be electrically connected to the conductor layer. The plurality of vias may be arranged in the stacking direction. According to this configuration, in a compact multilayer filter, the length of the conductive path in the inductor conductor can be secured.

In the one aspect described above, the conductor layer may be included in the second dielectric layer. In this case, desired spurious can be adjusted more easily.

In the one aspect described above, half or more of the plurality of vias may be included in the second dielectric layer. In this case, desired spurious can be adjusted more easily.

In the one aspect described above, the plurality of dielectric layers may include a plurality of the second dielectric layers. The first dielectric layer may be interposed between the plurality of second dielectric layers. The multilayer body may have a mounting surface and a facing surface. The facing surface may face the mounting surface in the stacking direction of the plurality of dielectric layers. The first dielectric layer may be closer to the mounting surface than to the facing surface. In this case, the stray capacitance can be reduced in a state in which the multilayer filter is mounted. The inductor conductor is arranged at a location relatively far from the ground. As a result, the Q value can be secured.

The present invention will become more fully understood from the detailed description given hereinafter and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF EMBODIMENTS

Figure 1:
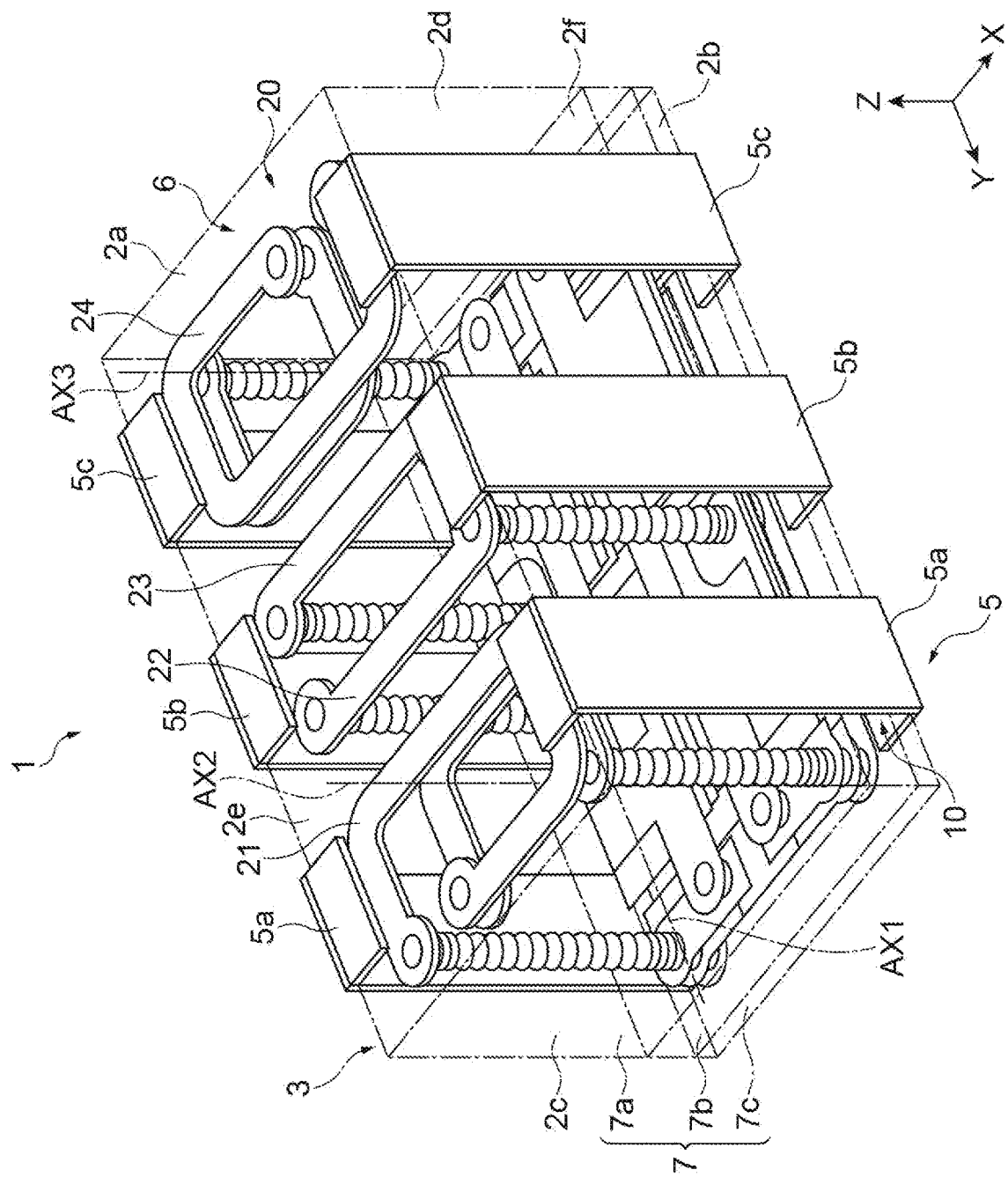
FIG. 1 is a perspective view of a multilayer filter according to the present embodiment.

Hereinafter, embodiments of the present invention will be described in detail with reference to the accompanying drawings. In the description of the diagrams, the same reference numerals are used for the same or equivalent elements, and repeated description thereof will be omitted.

Figure 2:
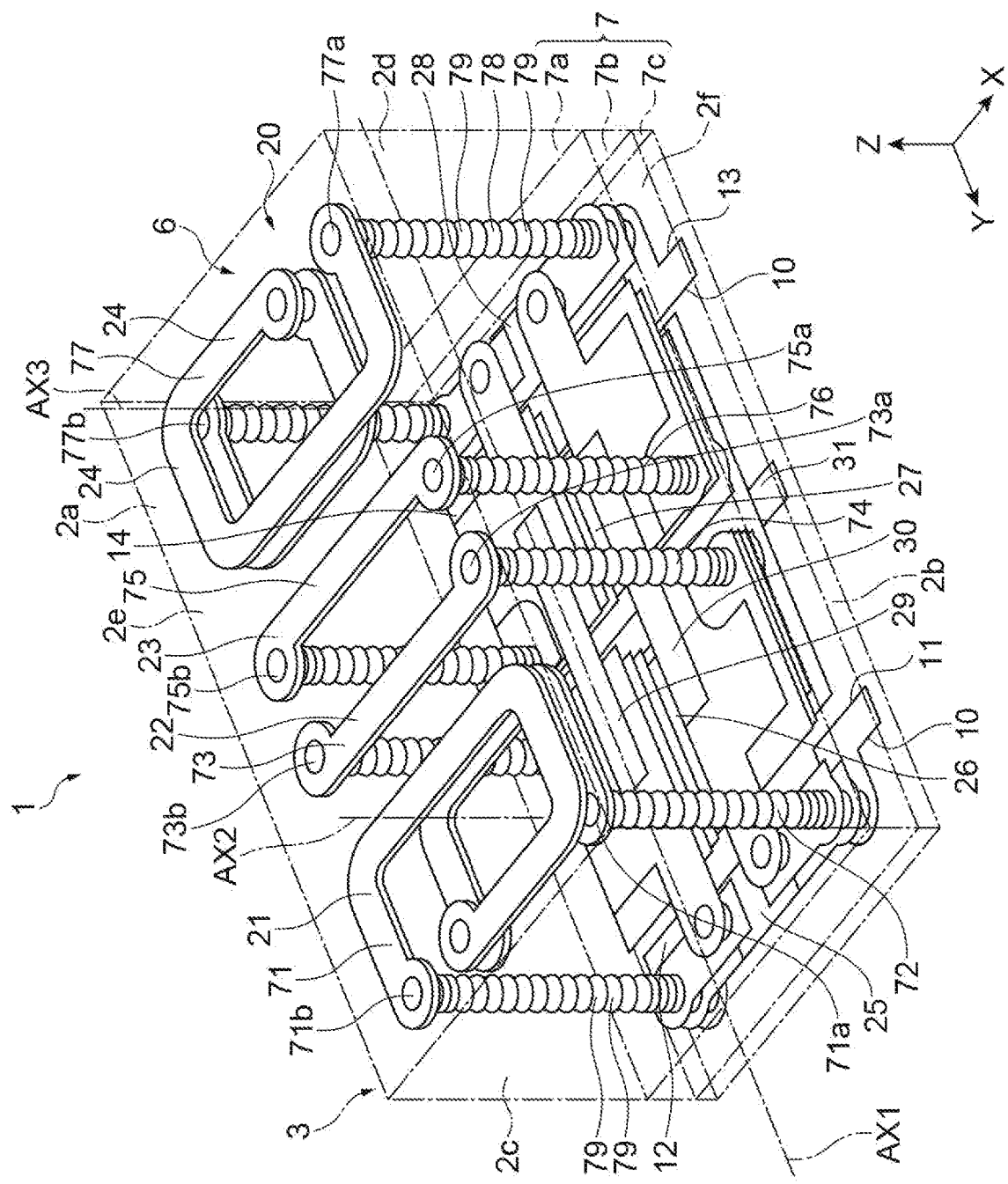
FIG. 2 is a perspective view illustrating a conductor unit of the multilayer filter.
Figure 3:
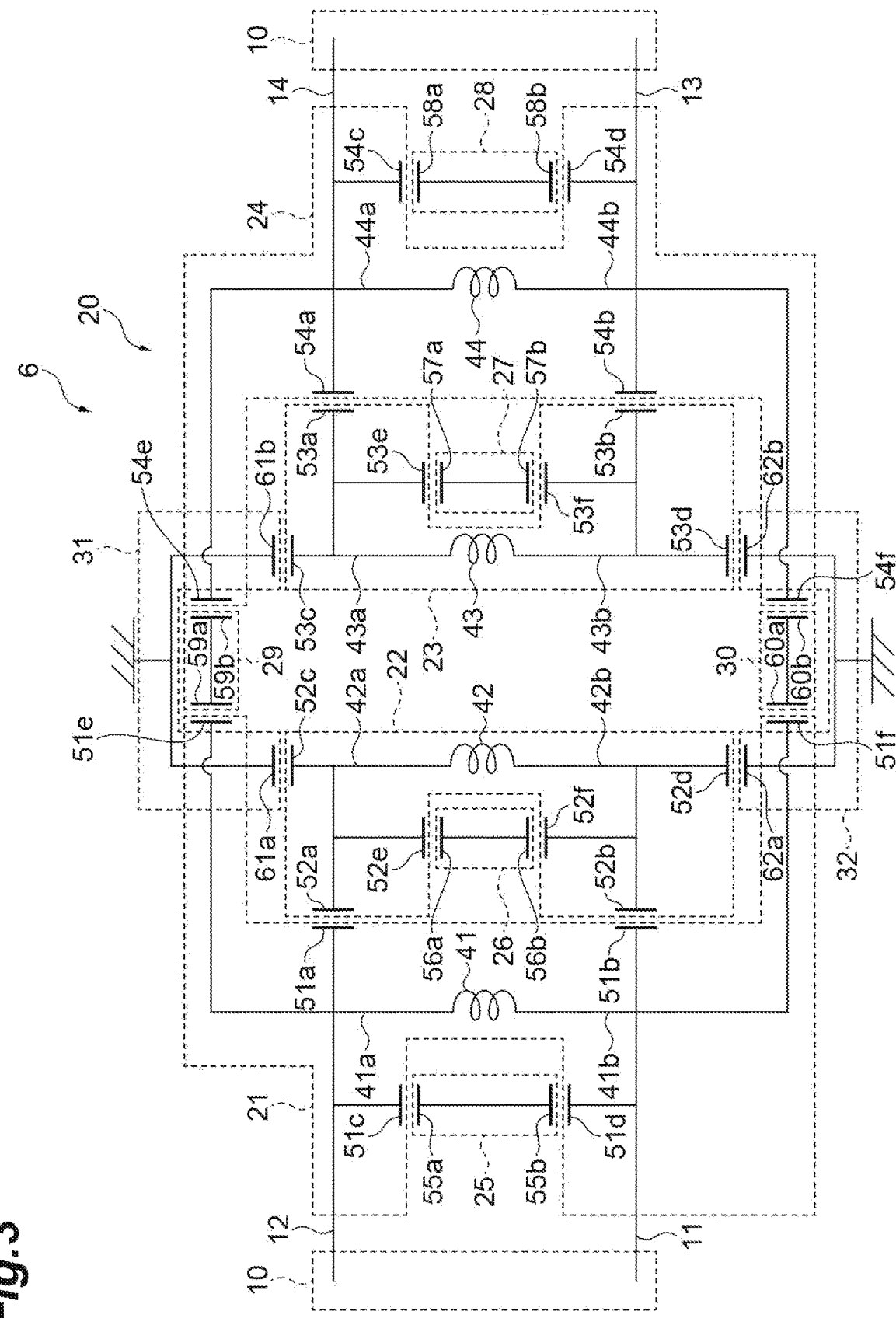
FIG. 3 is a circuit diagram of the multilayer filter.

First, a multilayer filter according to the present embodiment will be described with reference to FIGS. 1 to 3. FIG. 1 is a perspective view of the multilayer filter according to the present embodiment. FIG. 2 is a partial perspective view of the multilayer filter. The X-axis direction, the Y-axis direction, and the Z-axis direction are directions crossing each other. In the present embodiment, the X-axis direction, the Y-axis direction, and the Z-axis direction are perpendicular to each other. FIG. 3 is a circuit diagram of the multilayer filter. In this specification, "perpendicular" includes configurations that deviate within manufacturing tolerances.

A multilayer filter 1 is a balanced filter. The multilayer filter 1 includes a plurality of LC resonant circuits. The multilayer filter 1 includes, for example, a bandpass filter with balanced-balanced characteristics. The multilayer filter 1 processes a balanced signal, for example. When a balanced signal is used in the signal transmission method, noise is reduced compared with a case where no balanced signal is used. The multilayer filter 1 is solder-mounted in an electronic device, for example. The electronic device includes, for example, a circuit board or an electronic component. The multilayer filter 1 includes a multilayer body 3 and conductor units 5 and 6.

The multilayer body 3 has, for example, an insulating property. The multilayer body 3 is formed of, for example, a magnetic material. The magnetic material contains, for example, at least one selected from an Ni—Cu—Zn-based ferrite material, an Ni—Cu—Zn—Mg-based ferrite material, and an Ni—Cu-based ferrite material. The magnetic material forming the multilayer body 3 may contain an Fe alloy or the like. The multilayer body 3 may be formed of a non-magnetic material. The non-magnetic material contains, for example, at least one selected from a glass-ceramic material and a dielectric material.

The multilayer body 3 has, for example, a rectangular parallelepiped shape. Examples of the rectangular parallelepiped shape include a rectangular parallelepiped shape with chamfered corner portions and ridge portions and a rectangular parallelepiped shape with rounded corner portions and ridge portions. The shape of the multilayer body 3 is not limited to the rectangular parallelepiped shape. In the present embodiment, the Z-axis direction corresponds to the height direction of the multilayer body 3, and the X-axis direction and the Y-axis direction correspond to the short-length direction and longitudinal direction of the multilayer body 3. For example, the length of the multilayer body 3 in the height direction is shorter than the length of the multilayer body 3 in the short-length direction.

The multilayer body 3 has, as its outer surfaces, a pair of main surfaces 2a and 2b, a pair of end surfaces 2c and 2d, and a pair of side surfaces 2e and 2f. The pair of main surfaces 2a and 2b face each other in the Z-axis direction. The pair of end surfaces 2c and 2d face each other in the Y-axis direction. The pair of side surfaces 2e and 2f face each other in the X-axis direction. The pair of main surfaces 2a and 2b, the pair of end surfaces 2c and 2d, and the pair of side surfaces 2e and 2f are, for example, planes. The pair of main surfaces 2a and 2b extend along, for example, the X-axis direction and the Y-axis direction. The pair of end surfaces 2c and 2d extend along, for example, the Y-axis direction and the Z-axis direction. The pair of side surfaces 2e and 2f extend along, for example, the X-axis direction and the Z-axis direction.

For example, the main surface 2b is defined as a mounting surface facing another electronic device when mounted on another electronic device. The main surface 2a corresponds to a facing surface that faces the main surface 2b in the Z-axis direction.

The multilayer body 3 includes a plurality of dielectric layers 7. In the multilayer body 3, the plurality of dielectric layers 7 are stacked in the Z-axis direction. In other words, the Z-axis direction corresponds to the stacking direction of the plurality of dielectric layers 7. Each dielectric layer 7 corresponds to an insulator layer. Each dielectric layer 7 is formed of, for example, a sintered body of a ceramic green sheet containing a dielectric material. The dielectric material contains, for example, at least one selected from a $BaTiO_3$-based material, a $Ba(Ti, Zr)O_3$-based material, a $(Ba, Ca)TiO_3$-based material, a glass material, and an alumina material.

In the example illustrated in the present embodiment, the length of the multilayer body 3 in the X-axis direction is 1.25 mm. The length of the multilayer body 3 in the Y-axis direction is 2.00 mm. The length of the multilayer body 3 in the Z-axis direction is 0.95 mm.

The conductor unit 5 is provided on the outer surface of the multilayer body 3. The conductor unit 5 is formed by using a known technique. The conductor unit 5 is formed of, for example, a metal material. The metal material is, for example, copper, silver, gold, nickel, or chromium. The conductor unit 5 is formed, for example, by performing plating processing on an electrode layer. The electrode layer is formed of, for example, a conductive paste. The conductive paste is applied by using, for example, a printing method or a transfer method. The plating processing is, for example, electrolytic plating or electroless plating. By the plating processing, a plating layer is formed on the outer surface of the conductive paste.

The conductor unit 5 includes three pairs of external electrodes 5a, 5b, and 5c spaced apart from each other. Each of the three pairs of external electrodes 5a, 5b, and 5c is connected to the conductor unit 6. In this specification, "connected" means being connected in a state of direct contact. "Direct contact" means being connected to each other without another member illustrated in this specification being interposed. "Direct contact" does not exclude being connected through a member not specified in this specification.

One of each of the pair of external electrodes 5a, 5b, and 5c is provided on the side surface 2e and the main surfaces 2a and 2b, and is arranged in the Y-axis direction. One of each of the pair of external electrodes 5a, 5b, and 5c extends in the Z-axis direction between the main surfaces 2a and 2b. The other of each of the pair of external electrodes 5a, 5b, and 5c is provided on the side surface 2f and the main surfaces 2a and 2b, and is arranged in the X-axis direction. The other of each of the pair of external electrodes 5a, 5b, and 5c extends in the Z-axis direction between the main surfaces 2a and 2b.

The conductor unit 6 is provided inside the multilayer body 3. The conductor unit 6 includes an input/output portion 10 and a plurality of electrical circuits 20. The plurality of electrical circuits 20 are electromagnetically connected to each other inside the multilayer body 3 to form one filter circuit. In this specification, "electromagnetic connection" includes an electrical connection and a magnetic connection. "Electrical connection" includes a connection through which a DC component is transmitted and a connection through which only an AC component is transmitted without transmitting a DC component. In this specification, the electrical connection is also simply referred to as "connection".

Through the input/output portion 10, input signals are transmitted to the plurality of electrical circuits 20, and signals transmitted from the plurality of electrical circuits 20 are output. For example, a signal is input to the input/output portion 10 from the outside of the multilayer filter 1, and a signal is output from the input/output portion 10 to the outside of the multilayer filter 1. The input/output portion 10 includes an input/output port group including two pairs of balanced ports 11, 12, 13, and 14. Through the two pairs of balanced ports 11, 12, 13, and 14, balanced signals are input and output. In other words, a signal input and output to and from the balanced port 11 and a signal input and output to and from the balanced port 12 have opposite polarities. A signal input and output to and from the balanced port 13 and a signal input and output to and from the balanced port 14 have opposite polarities.

The plurality of electrical circuits 20 are electrically connected to the input/output portion 10. The plurality of electrical circuits 20 are electromagnetically connected to each other. The plurality of electrical circuits 20 include a plurality of resonant circuits. The plurality of electrical circuits 20 have mirror-symmetrical structures in the Y-axis direction. The plurality of electrical circuits 20 include electrical circuits 21, 22, 23, 24, 25, 26, 27, 28, 29, 30, 31, and 32. The electrical circuits 21, 22, 23, and 24 correspond to resonant circuits. The electrical circuits 21, 22, 23, and 24 are, for example, LC resonant circuits. Each of the electrical circuits 21, 22, 23, and 24 forms an inductor and a capacitor. The plurality of electrical circuits 21, 22, 23, and 24 are arranged in the direction crossing the stacking direction of the plurality of dielectric layers 7. The plurality of electrical circuits 21, 22, 23, and 24 are arranged in the Y-axis direction. The plurality of electrical circuits 21, 22, 23, and 24 are electromagnetically connected to each other.

The electrical circuits 21, 22, 23, 24, 25, 26, 27, 28, 29, 30, 31, and 32 are spaced apart from each other. In this specification, when "spaced apart" is used for the electrical circuit, "spaced apart" means a state in which there is no physical connection through a conductor and no DC component is transmitted. The electrical circuits 21, 22, 23, 24, 25, 26, 27, 28, 29, 30, 31, and 32 are electrically connected to each other.

Each electrical circuit 20 is formed by a plurality of conductors. Conductors forming each electrical circuit 20 contain at least one selected from Ag and Pd, for example. A plating layer is formed on the surface of each terminal electrode. The plated layer is formed, for example, by electroplating. The plating layer has such as a layer structure including a Cu plating layer, an Ni plating layer, and an Sn plating layer, or a layer structure including an Ni plating layer and an Sn plating layer.

As illustrated in FIG. 3, the electrical circuit 21 includes an inductor conductor 41 forming an inductor and capacitor conductors 51a, 51b, 51c, 51d, 51e, and 51f forming capacitors. The inductor conductor 41 corresponds to a coil. The inductor conductor 41 includes a pair of ends 41a and 41b. In the electrical circuit 21, the end 41a and the capacitor conductors 51a, 51c, and 51e are electrically connected to each other. The balanced port 12 and the end 41a are electrically connected to each other. In the electrical circuit 21, the end 41b and the capacitor conductors 51b, 51d, and 51f are electrically connected to each other. The balanced port 11 and the end 41b are electrically connected to each other.

In the multilayer filter 1, the electrical circuit 21 corresponds to at least a part of a first resonant circuit. In the multilayer filter 1, the capacitor conductors 51a, 51c, and 51e correspond to capacitor conductors forming a third capacitor, and the capacitor conductors 51b, 51d, and 51f correspond to capacitor conductors forming a fourth capacitor. The end 41a corresponds to a third end, and the end 41b corresponds to a fourth end.

The electrical circuit 22 includes an inductor conductor 42 forming an inductor and capacitor conductors 52a, 52b, 52c, 52d, 52e, and 52f forming capacitors. The electrical circuit 21 and the electrical circuit 22 are connected to each other by AC coupling. The inductor conductor 42 corresponds to a coil. A capacitor is formed by the capacitor conductor 51a and the capacitor conductor 52a. A capacitor is formed by the capacitor conductor 51b and the capacitor conductor 52b. The inductor conductor 42 includes a pair of ends 42a and 42b. In the electrical circuit 22, the end 42a and the capacitor conductors 52a, 52c, and 52e are electrically connected to each other. In the electrical circuit 22, the end 42b and the capacitor conductors 52b, 52d, and 52e are electrically connected to each other.

The electrical circuit 23 includes an inductor conductor 43 forming an inductor and capacitor conductors 53a, 53b, 53c, 53d, 53e, and 53f forming capacitors. The inductor conductor 43 corresponds to a coil. The inductor conductor 42 and the inductor conductor 43 are magnetically coupled to each other. The inductor conductor 43 includes a pair of ends 43a and 43b. In the electrical circuit 23, the end 43a and the capacitor conductors 53a, 53c, and 53e are electrically connected to each other. In the electrical circuit 23, the end 43b and the capacitor conductors 53b, 53d, and 53f are electrically connected to each other. The electrical circuit 23 has a configuration that is mirror-symmetrical to the electrical circuit 24.

The electrical circuit 24 includes an inductor conductor 44 forming an inductor and capacitor conductors 54a, 54b, 54c, 54d, 54e, and 54f forming capacitors. The inductor conductor 44 corresponds to a coil. A capacitor is formed by the capacitor conductor 53a and the capacitor conductor 54a. A capacitor is formed by the capacitor conductor 53b and the capacitor conductor 54b. The inductor conductor 44 includes a pair of ends 44a and 44b. In the electrical circuit 24, the end 44a and the capacitor conductors 54a, 54c, and 54e are electrically connected to each other. The balanced port 13 and the end 44b are electrically connected to each other. In the electrical circuit 24, the end 44b and the capacitor conductors 54b, 54d, and 54f are electrically connected to each other. The balanced port 14 and the end 44a are electrically connected to each other. The electrical circuit 24 has a configuration that is mirror-symmetrical to the electrical circuit 21.

In the multilayer filter 1, the electrical circuit 24 corresponds to at least a part of a second resonant circuit. In the multilayer filter 1, the capacitor conductors 54a, 54c, and 54e correspond to capacitor conductors forming a first capacitor, and the capacitor conductors 54b, 54d, and 54f correspond to capacitor conductors forming a fourth capacitor. The end 44a corresponds to a first end, and the end 44b corresponds to a second end.

The electrical circuit 25 includes capacitor conductors 55a and 55b forming a capacitor. The electrical circuit 21 and the electrical circuit 25 are connected to each other by AC coupling. A capacitor is formed by the capacitor conductor 51c and the capacitor conductor 55a. A capacitor is formed by the capacitor conductor 51d and the capacitor conductor 55b. In the electrical circuit 25, the capacitor conductor 55a and the capacitor conductor 55b are electrically connected to each other.

The electrical circuit 26 includes capacitor conductors 56a and 56b forming a capacitor. The electrical circuit 22 and the electrical circuit 26 are connected to each other by AC coupling. A capacitor is formed by the capacitor conductor 52e and the capacitor conductor 56a. A capacitor is formed by the capacitor conductor 52f and the capacitor conductor 56b. In the electrical circuit 26, the capacitor conductor 56a and the capacitor conductor 56b are electrically connected to each other.

The electrical circuit 27 includes capacitor conductors 57a and 57b forming a capacitor. The electrical circuit 23 and the electrical circuit 27 are connected to each other by AC coupling. A capacitor is formed by the capacitor conductor 53e and the capacitor conductor 57a. A capacitor is formed by the capacitor conductor 53f and the capacitor conductor 57b. In the electrical circuit 27, the capacitor conductors 57a and 57b are electrically connected to each other.

The electrical circuit 28 includes capacitor conductors 58a and 58b forming a capacitor. The electrical circuit 24 and the electrical circuit 28 are connected to each other by AC coupling. A capacitor is formed by the capacitor conductor 54c and the capacitor conductor 58a. A capacitor is formed by the capacitor conductor 54d and the capacitor conductor 58b. In the electrical circuit 28, the capacitor conductor 58a and the capacitor conductor 58b are electrically connected to each other.

The electrical circuit 29 includes capacitor conductors 59a and 59b forming a capacitor. The electrical circuit 21 and the electrical circuit 29 are connected to each other by AC coupling. The electrical circuit 24 and the electrical circuit 29 are connected to each other by AC coupling. A capacitor is formed by the capacitor conductor 51e and the capacitor conductor 59a. A capacitor is formed by the capacitor conductor 54e and the capacitor conductor 59b. In the electrical circuit 29, the capacitor conductor 59a and the capacitor conductor 59b are electrically connected to each other.

The electrical circuit 30 includes capacitor conductors 60a and 60b forming a capacitor. The electrical circuit 21 and the electrical circuit 30 are connected to each other by AC coupling. The electrical circuit 24 and the electrical circuit 30 are connected to each other by AC coupling. A capacitor is formed by the capacitor conductor 51f and the capacitor conductor 60a. A capacitor is formed by the capacitor conductor 54f and the capacitor conductor 60b. In the electrical circuit 30, the capacitor conductor 60a and the capacitor conductor 60b are electrically connected to each other.

The electrical circuit 31 includes capacitor conductors 61a and 61b forming a capacitor. The electrical circuit 22 and the electrical circuit 31 are connected to each other by AC coupling. The electrical circuit 23 and the electrical circuit 31 are connected to each other by AC coupling. In the electrical circuit 31, the capacitor conductors 61a and 61b are grounded. A capacitor is formed by the capacitor conductor 52c and the capacitor conductor 61a. A capacitor is formed by the capacitor conductor 53c and the capacitor conductor 61b.

The electrical circuit 32 includes capacitor conductors 62a and 62b forming a capacitor. The electrical circuit 22 and the electrical circuit 32 are connected to each other by AC coupling. The electrical circuit 23 and the electrical circuit 32 are connected to each other by AC coupling. In the electrical circuit 32, the capacitor conductors 62a and 62b are grounded. A capacitor is formed by the capacitor conductor 52d and the capacitor conductor 62a. A capacitor is formed by the capacitor conductor 53d and the capacitor conductor 62b.

As illustrated in FIG. 2, the inductor conductors 41, 42, 43, and 44 are arranged inside the multilayer body 3. The inductor conductors 42 and 43 form a coil axis AX1. The coil axis AX1 extends along a direction perpendicular to the stacking direction. The inductor conductor 41 forms a coil axis AX2. The inductor conductor 42 forms a coil axis AX3. The coil axes AX2 and AX3 extend along the stacking direction. In the present embodiment, the coil axis AX1 extends along the Y-axis direction. The coil axes AX2 and AX3 extend along the Z-axis direction.

In the present embodiment, the inductor conductors 41 and 44 are two-turn coils. The inductor conductors 42 and 43 are single turn coils. The inductor conductor 41 includes, for example, at least one conductor layer 71 and a plurality of connection conductors 72. The inductor conductor 42 includes, for example, at least one conductor layer 73 and a plurality of connection conductors 74. The inductor conductor 43 includes, for example, at least one conductor layer 75 and a plurality of connection conductors 76. The inductor conductor 44 includes, for example, at least one conductor layer 77 and a plurality of connection conductors 78.

The conductor layers 71, 73, 75, and 77 extend along the dielectric layer 7. The conductor layers 71, 73, 75, and 77 are interposed between a pair of dielectric layers 7. The conductor layers 71, 73, 75, and 77 include a pair of ends 71a and 71b, 73a and 73b, 75a and 75b, and 77a and 77b located opposite to each other, respectively.

Each of the plurality of connection conductors 72 is connected to the conductor layer 71. Each of the plurality of connection conductors 74 is connected to the conductor layer 73. Each of the plurality of connection conductors 76 is connected to the conductor layer 75. Each of the plurality of connection conductors 78 is connected to the conductor layer 77. Each of the connection conductors 72, 74, 76, and 78 extends in the Z-axis direction. Each of the connection conductors 72, 74, 76, and 78 is formed by a plurality of vias 79 penetrating the dielectric layer 7. In other words, each of the inductor conductors 41, 42, 43, and 44 includes the conductor layers 71, 73, 75, and 77 and a plurality of vias 79. The plurality of vias 79 are electrically connected to corresponding conductor layers among the plurality of conductor layers 71, 73, 75, and 77. The plurality of vias 79 are arranged in the stacking direction.

The plurality of connection conductors 72 include the connection conductor 72 connected to the end 71a and the connection conductor 72 connected to the end 71b. The plurality of connection conductors 74 include the connection conductor 74 connected to the end 73a and the connection conductor 74 connected to the end 73b. The plurality of connection conductors 76 include the connection conductor 76 connected to the end 75a and the connection conductor 76 connected to the end 75b. The plurality of connection conductors 78 include the connection conductor 78 connected to the end 77a and the connection conductor 78 connected to the end 77b.

For example, one of the pair of external electrodes 5a is connected to the connection conductor 72 connected to the end 71a and is connected to the balanced port 11. The other of the pair of external electrodes 5a is connected to the connection conductor 72 connected to the end 71a and is connected to the balanced port 12. The other of the pair of external electrodes 5a is connected to the connection conductor 72 connected to the end 71b and is connected to the balanced port 12. The pair of external electrodes 5b are connected to electrical circuits 31 and 32. One of the pair of external electrodes 5c is connected to the connection conductor 78 connected to the end 77a and is connected to the balanced port 13. The other of the pair of external electrodes 5c is connected to the connection conductor 68 connected to the end 77b and is connected to the balanced port 14.

The plurality of dielectric layers 7 include a dielectric layer 7a, a dielectric layer 7b, and a dielectric layer 7c. For example, the dielectric layer 7b is interposed between the dielectric layer 7a and the dielectric layer 7c. The dielectric layers 7a to 7c are arranged from the main surface 2a side toward the main surface 2b side in the Z-axis direction. The dielectric layer 7a forms the main surface 2a. The dielectric layer 7c forms the main surface 2b. In the Z-axis direction, the thickness of the dielectric layer 7a is larger than the thickness of the dielectric layer 7c. The dielectric layer 7b is closer to the main surface 2b than to the main surface 2a. In other words, the dielectric layer 7b is closer to the mounting surface than to the facing surface.

The dielectric layers 7a and 7c have dielectric constants lower than that of the dielectric layer 7b. The dielectric constant of a material forming each of the dielectric layers 7a and 7c is lower than the dielectric constant of a material forming the dielectric layer 7b. Each of the dielectric layer 7a and the dielectric layer 7c corresponds to a second dielectric layer, and the dielectric layer 7b corresponds to a first dielectric layer.

All of the capacitor conductors of each electrical circuit 20 are provided in the dielectric layer 7b. In all the capacitors included in each electrical circuit 20, the dielectric layer 7b is filled between the capacitor conductors forming each capacitor. All of the capacitor conductors of each electrical circuit 20 may be included in the dielectric layer 7b.

At least parts of the inductor conductors 41, 42, 43, and 44 are provided in the dielectric layer 7a. For example, at least parts of the inductor conductors 41, 42, 43, and 44 are included in the dielectric layer 7a. The conductor layers 71, 73, 75, and 77 are included in the dielectric layer 7a. Half or more of the plurality of vias 79 are included in the dielectric layer 7a. In other words, half the volume or more of each of the connection conductors 72, 74, 76, and 78 is included in the dielectric layer 7a.

Figure 4:
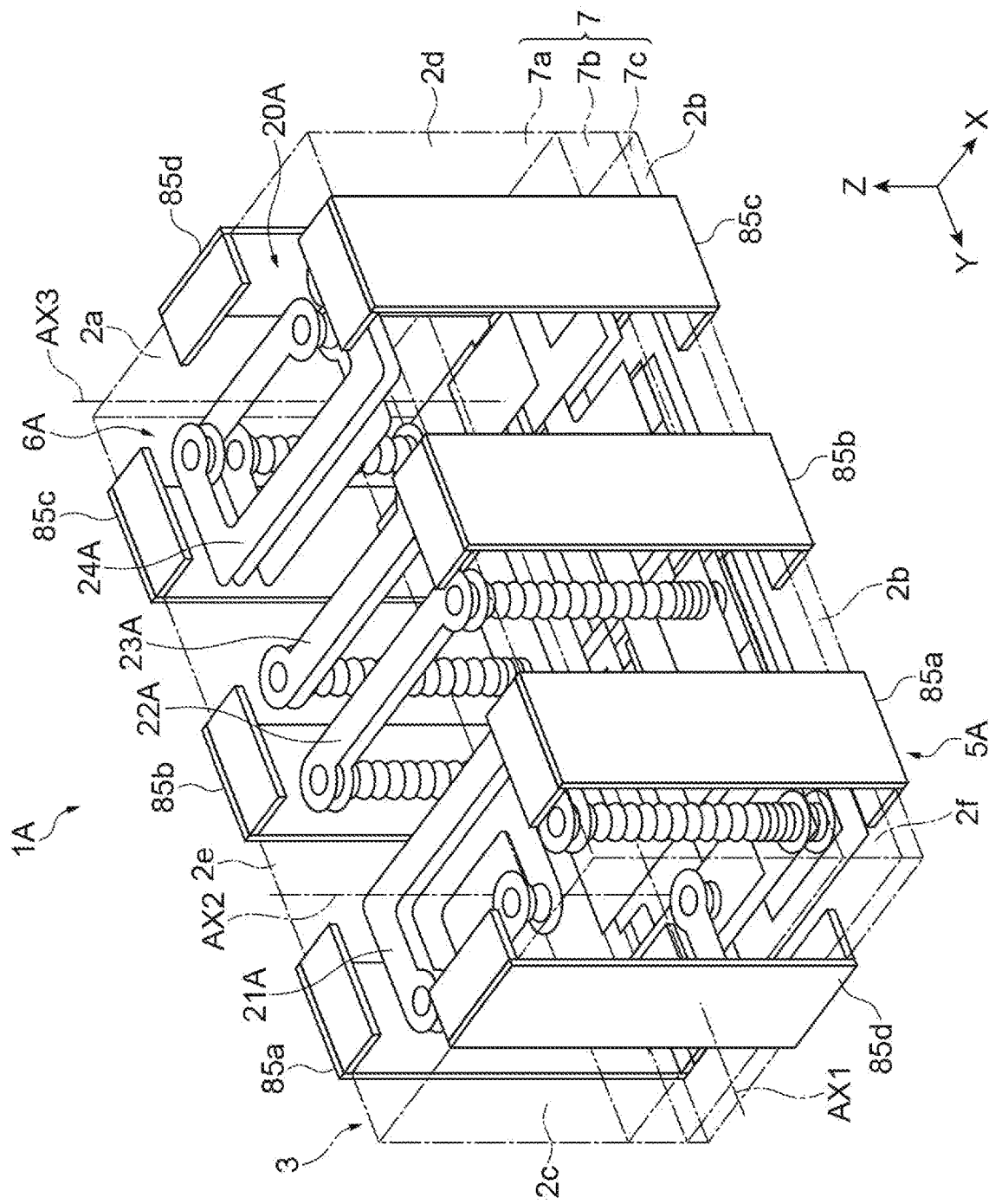
FIG. 4 is a perspective view of a multilayer filter according to a modification example of the present embodiment.
Figure 5:
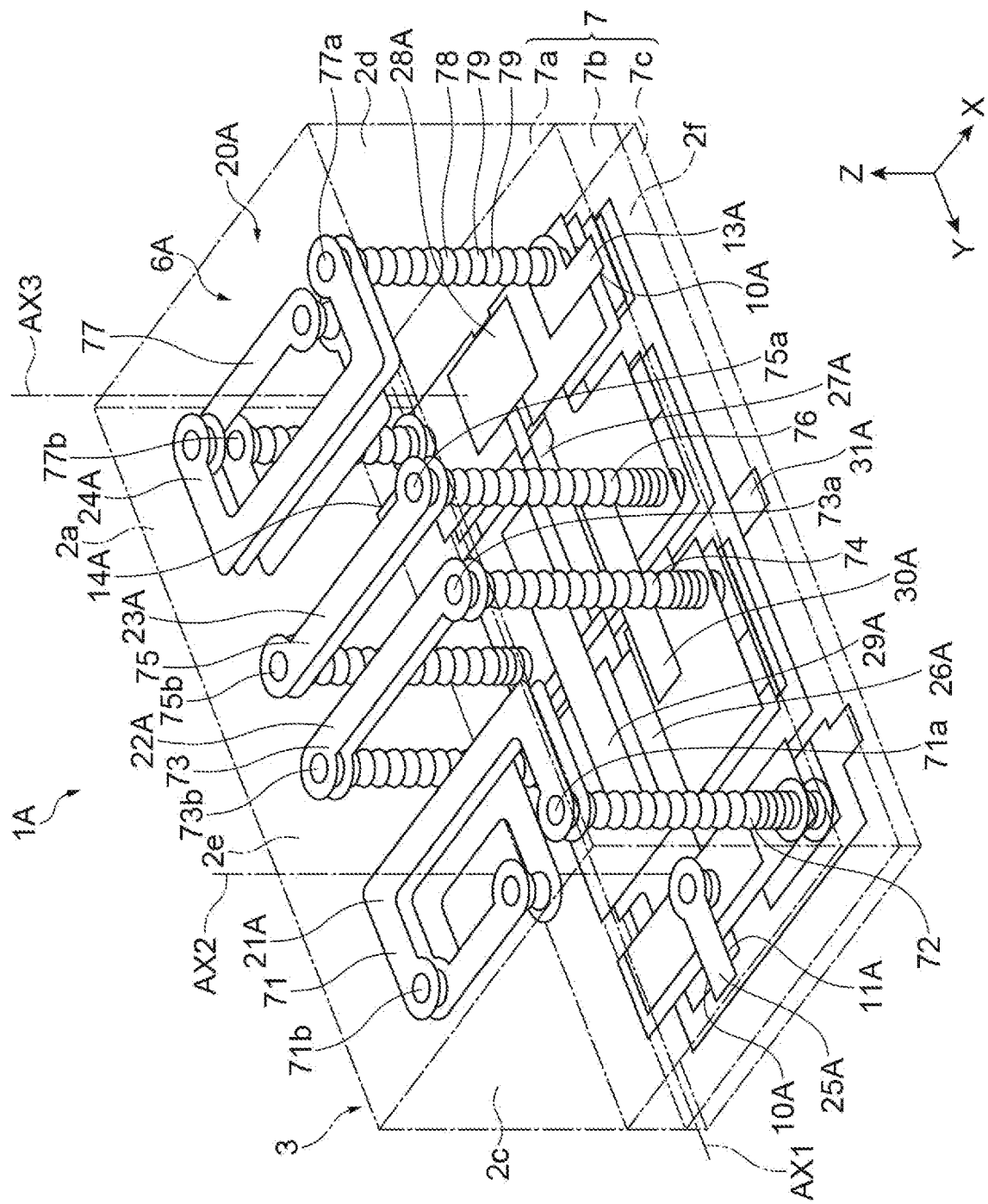
FIG. 5 is a perspective view illustrating a conductor unit of the multilayer filter.
Figure 6:
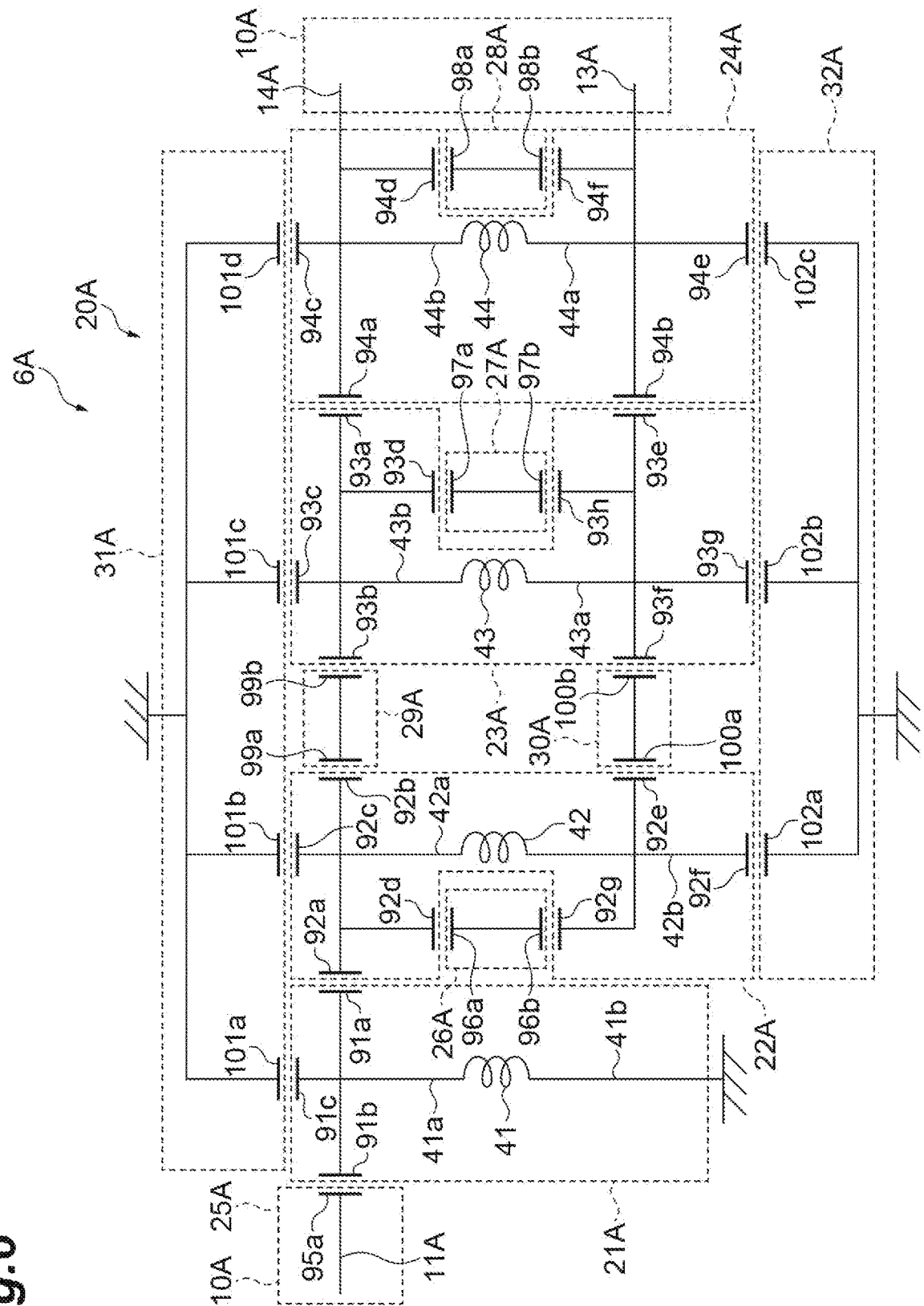
FIG. 6 is a circuit diagram of the multilayer filter.

Next, a multilayer filter according to a modification example of the present embodiment will be described with reference to FIGS. 4 to 7. FIG. 4 is a perspective view of the multilayer filter according to the modification example of the present embodiment. FIG. 5 is a partial perspective view of the multilayer filter. FIG. 6 is a circuit diagram of the multilayer filter. This modification example is generally similar to or the same as the above-described embodiment. This modification example is different from the above-described embodiment in that the multilayer filter includes a bandpass filter with unbalanced-balanced characteristics. Hereinafter, the differences between the above-described embodiment and the modification example will be mainly described.

In this modification example, a multilayer filter 1A includes a bandpass filter with unbalanced-balanced characteristics. The multilayer filter 1A includes conductor units 5A and 6A instead of the conductor units 5 and 6. The conductor unit 5A includes four pairs of external electrodes 85a, 85b, 85c, and 85d spaced apart from each other. Each of the four pairs of external electrodes 85a, 85b, 85c, and 85d is connected to the conductor unit 6A.

One of each of the pair of external electrodes 85a, 85b, and 85c is provided on the side surface 2e and the main surfaces 2a and 2b, and is arranged in the Y-axis direction. One of each of the pair of external electrodes 85a, 85b, and 85c extends in the Z-axis direction between the main surfaces 2a and 2b. The other of each of the pair of external electrodes 85a, 85b, and 85c is provided on the side surface 2f and the main surfaces 2a and 2b, and is arranged in the Y-axis direction. The other of each of the pair of external electrodes 85a, 85b, and 85c extends in the Z-axis direction between the main surfaces 2a and 2b.

One of each of the pair of external electrodes 85d is provided on the end surface 2c and the main surfaces 2a and 2b. One of each of the pair of external electrodes 85d extends in the Z-axis direction between the main surfaces 2a and 2b. The other of each of the pair of external electrodes 85d is provided on the end surface 2d and the main surfaces 2a and 2b. The other of each of the pair of external electrodes 85d extends in the Z-axis direction between the main surfaces 2a and 2b.

The conductor unit 6A includes an input/output portion 10A and a plurality of electrical circuits 20A. The plurality of electrical circuits 20A are electromagnetically connected to each other inside the multilayer body 3 to form one filter circuit.

Through the input/output portion 10A, input signals are transmitted to the plurality of electrical circuits 20A, and signals transmitted from the plurality of electrical circuits 20A are output. For example, a signal is input to the input/output portion 10A from the outside of the multilayer filter 1A, and a signal is output from the input/output portion 10A to the outside of the multilayer filter 1A. The input/output portion 10A includes an input/output port group including an unbalanced port 11A and a pair of balanced ports 13A and 14A. Through the pair of balanced ports 13A and 14A, balanced signals are input and output. In other words, a signal input and output to and from the balanced port 13A and a signal input and output to and from the balanced port 14A have opposite polarities.

The plurality of electrical circuits 20A are connected to the input/output portion 10A. The plurality of electrical circuits 20A are electromagnetically connected to each other. The plurality of electrical circuits 20A include a plurality of resonant circuits. The plurality of electrical circuits 20A include electrical circuits 21A, 22A, 23A, 24A, 25A, 26A, 27A, 28A, 29A, 30A, 31A, and 32A. The electrical circuits 21A, 22A, 23A, and 24A correspond to resonant circuits. The electrical circuits 21A, 22A, 23A, and 24A are, for example, LC resonant circuits. Each of the electrical circuits 21A, 22A, 23A, and 24A forms an inductor and a capacitor. The plurality of electrical circuits 21A, 22A, 23A, and 24A are arranged in the direction crossing the stacking direction of the plurality of dielectric layers 7. The plurality of electrical circuits 21A, 22A, 23A, and 24A are arranged in the Y-axis direction. The plurality of electrical circuits 21A, 22A, 23A, and 24A are electromagnetically connected to each other.

The electrical circuits 21A, 22A, 23A, 24A, 25A, 26A, 27A, 28A, 29A, 30A, 31A, and 32A are spaced apart from each other. The electrical circuits 21A, 22A, 23A, 24A, 25A, 26A, 27A, 28A, 29A, 30A, 31A, and 32A are electrically connected to each other.

Each electrical circuit 20A is formed by a plurality of conductors. Conductors forming each electrical circuit 20A contain at least one selected from Ag and Pd, for example. A plating layer is formed on the surface of each terminal electrode. The plated layer is formed, for example, by electroplating. The plating layer has such as a layer structure including a Cu plating layer, an Ni plating layer, and an Sn plating layer, or a layer structure including an Ni plating layer and an Sn plating layer.

As illustrated in FIG. 6, the electrical circuit 21A includes an inductor conductor 41 forming an inductor and capacitor conductors 91a, 91b, and 91c forming capacitors. In the electrical circuit 21A, the end 41a and the capacitor conductors 91a, 91b, and 91c are electrically connected to each other. The end 41b is grounded. In this modification example, the electrical circuit 21A corresponds to at least a part of the first resonant circuit, and the capacitor conductors 91a, 91b, 91c correspond to capacitor conductors forming the third capacitor. The end 41a corresponds to a third end, and the end 41b corresponds to a fourth end.

The electrical circuit 22A includes an inductor conductor 42 forming an inductor and capacitor conductors 92a, 92b, 92c, 92d, 92e, 92f, and 92g forming capacitors. The electrical circuit 21A and the electrical circuit 22A are connected to each other by AC coupling. A capacitor is formed by the capacitor conductor 91a and the capacitor conductor 92a. In the electrical circuit 22A, the end 42a and the capacitor conductors 92a, 92b, 92c, and 92d are electrically connected to each other. In the electrical circuit 22A, the end 42b and the capacitor conductors 92e, 92f, and 92g are electrically connected to each other.

The electrical circuit 23A includes an inductor conductor 43 forming an inductor and capacitor conductors 93a, 93b, 93c, 93d, 93e, 93f, 93g, and 93h forming capacitors. In the electrical circuit 23A, the end 43b and the capacitor conductors 93a, 93b, 93c, and 93d are electrically connected to each other. In the electrical circuit 23A, the end 43a and the capacitor conductors 93e, 93f, 93g, and 93h are electrically connected to each other.

The electrical circuit 24A includes an inductor conductor 44 forming an inductor and capacitor conductors 94a, 94b, 94c, 94d, 94e, and 94f forming capacitors. The electrical circuit 23A and the electrical circuit 24A are connected to each other by AC coupling. A capacitor is formed by the capacitor conductor 93a and the capacitor conductor 94a. A capacitor is formed by the capacitor conductor 93b and the capacitor conductor 94b. In the electrical circuit 24A, the end 44b and the capacitor conductors 94a, 94c, and 94d are electrically connected to each other. The balanced port 13A and the end 44a are electrically connected to each other. In the electrical circuit 24A, the end 44a and the capacitor conductors 94b, 94e, and 94f are electrically connected to each other. The balanced port 14A and the end 44b are electrically connected to each other.

In this modification example, the electrical circuit 24A corresponds to at least a part of the second resonant circuit. The capacitor conductors 94a, 94c, and 94d correspond to capacitor conductors forming a first capacitor, and the capacitor conductors 94b, 94e, and 94f correspond to capacitor conductors forming a fourth capacitor. The end 44a corresponds to a first end, and the end 44b corresponds to a second end.

The electrical circuit 25A includes a capacitor conductor 95a forming a capacitor. The electrical circuit 21A and the electrical circuit 25A are connected to each other by AC coupling. A capacitor is formed by the capacitor conductor 91b and the capacitor conductor 95a. In the electrical circuit 25A, the unbalanced port 11A and the capacitor conductor 95a are connected to each other.

The electrical circuit 26A includes capacitor conductors 96a and 96b forming a capacitor. The electrical circuit 22A and the electrical circuit 26A are connected to each other by AC coupling. A capacitor is formed by the capacitor conductor 92d and the capacitor conductor 96a. A capacitor is formed by the capacitor conductor 92g and the capacitor conductor 96b. In the electrical circuit 26A, the capacitor conductor 96a and the capacitor conductor 96b are electrically connected to each other.

The electrical circuit 27A includes capacitor conductors 97a and 97b forming a capacitor. The electrical circuit 23A and the electrical circuit 27A are connected to each other by AC coupling. A capacitor is formed by the capacitor conductor 93d and the capacitor conductor 97a. A capacitor is formed by the capacitor conductor 93h and the capacitor conductor 97b. In the electrical circuit 27A, the capacitor conductor 97a and the capacitor conductor 97b are electrically connected to each other.

The electrical circuit 28A includes capacitor conductors 98a and 98b forming a capacitor. The electrical circuit 24A and the electrical circuit 28A are connected to each other by AC coupling. A capacitor is formed by the capacitor conductor 94d and the capacitor conductor 98a. A capacitor is formed by the capacitor conductor 94f and the capacitor conductor 98b. In the electrical circuit 28A, the capacitor conductor 98a and the capacitor conductor 98b are electrically connected to each other.

The electrical circuit 29A includes capacitor conductors 99a and 99b forming a capacitor. The electrical circuit 22A and the electrical circuit 29A are connected to each other by AC coupling. The electrical circuit 23A and the electrical circuit 29A are connected to each other by AC coupling. A capacitor is formed by the capacitor conductor 92b and the capacitor conductor 99a. A capacitor is formed by the capacitor conductor 93b and the capacitor conductor 99b. In the electrical circuit 29A, the capacitor conductor 99a and the capacitor conductor 99b are electrically connected to each other.

The electrical circuit 30A includes capacitor conductors 100a and 100b forming a capacitor. The electrical circuit 22A and the electrical circuit 30A are connected to each other by AC coupling. The electrical circuit 23A and the electrical circuit 30A are connected to each other by AC coupling. A capacitor is formed by the capacitor conductor 92e and the capacitor conductor 100a. A capacitor is formed by the capacitor conductor 93f and the capacitor conductor 100b. In the electrical circuit 30A, the capacitor conductor 100a and the capacitor conductor 100b are electrically connected to each other.

The electrical circuit 31A includes capacitor conductors 101a, 101b, 101c, and 101d forming capacitors. The electrical circuit 21A and the electrical circuit 31A are connected to each other by AC coupling. The electrical circuit 22A and the electrical circuit 31A are connected to each other by AC coupling. The electrical circuit 23A and the electrical circuit 31A are connected to each other by AC coupling. The electrical circuit 24A and the electrical circuit 31A are connected to each other by AC coupling. The capacitor conductors 101a, 101b, 101c, and 101d are grounded. A capacitor is formed by the capacitor conductor 91c and the capacitor conductor 101a. A capacitor is formed by the capacitor conductor 92c and the capacitor conductor 101b. A capacitor is formed by the capacitor conductor 93c and the capacitor conductor 101c. A capacitor is formed by the capacitor conductor 94c and the capacitor conductor 101d.

The electrical circuit 32A includes capacitor conductors 102a, 102b, and 102c forming capacitors. The electrical circuit 22A and the electrical circuit 32A are connected to each other by AC coupling. The electrical circuit 23A and the electrical circuit 32A are connected to each other by AC coupling. The electrical circuit 24A and the electrical circuit 32A are connected to each other by AC coupling. The capacitor conductors 102a, 102b, and 102c are grounded. A capacitor is formed by the capacitor conductor 92f and the capacitor conductor 102a. A capacitor is formed by the capacitor conductor 93g and the capacitor conductor 102b. A capacitor is formed by the capacitor conductor 94e and the capacitor conductor 102c.

For example, at least one of the pair of external electrodes 85a is connected to the electrical circuits 31A and 32A. At least one of the pair of external electrodes 85b is connected to the electrical circuits 31A and 32A. One of the pair of external electrodes 85c is connected to the connection conductor 78 connected to the end 77a and is connected to the balanced port 13A. The other of the pair of external electrodes 85c is connected to the connection conductor 78 connected to the end 77b and is connected to the balanced port 14A. One of the pair of external electrodes 85d is connected to the unbalanced port 11A.

All of the capacitor conductors of each electrical circuit 20A are provided in the dielectric layer 7b. In all the capacitors included in each electrical circuit 20A, the dielectric layer 7b is filled between the capacitor conductors forming each capacitor. All of the capacitor conductors of each electrical circuit 20A may be included in the dielectric layer 7b.

Next, the function and effect of the multilayer filters 1 and 1A according to the present embodiment and its modification example will be described. In the multilayer filter 1, the input/output portion 10 includes an input/output port group including two pairs of balanced ports 11 and 12 and 13 and 14. In the multilayer filter 1A, the input/output portion 10A includes an input/output port group A including the unbalanced port 11A and a pair of balanced ports 13A and 14A. In the multilayer filters 1 and 1A, the plurality of dielectric layers 7 includes the dielectric layer 7b and the dielectric layers 7a and 7c. The dielectric layers 7a and 7c have dielectric constants lower than that of the dielectric layer 7b. In the multilayer filter 1, for example, the capacitor conductors 54a to 54f of the electrical circuit 24 are provided in the dielectric layer 7b. The electrical circuits 21, 22, 23, and 24 correspond to resonant circuits. In the multilayer filter 1A, for example, the capacitor conductors 94a to 94f of the electrical circuit 24A are provided in the dielectric layer 7b. At least a part of the inductor conductor 44 is provided in the dielectric layer 7a.

In the resonant circuits of the multilayer filters 1 and 1A, when the inductor conductor is included in the dielectric layer 7 having a relatively low dielectric constant, the self-resonant frequency of the resonant circuit increases. According to the above configuration, a frequency range in which spurious occurs can be adjusted, and spurious in a desired frequency range can be reduced. Since the capacitor conductors are provided in the dielectric layer 7b, the size of the capacitor can be reduced compared with a case where all the capacitor conductors are provided in the dielectric layer 7a. Therefore, spurious in a desired frequency range can be reduced while suppressing an increase in the size of the multilayer filters 1 and 1A.

Figure 7:
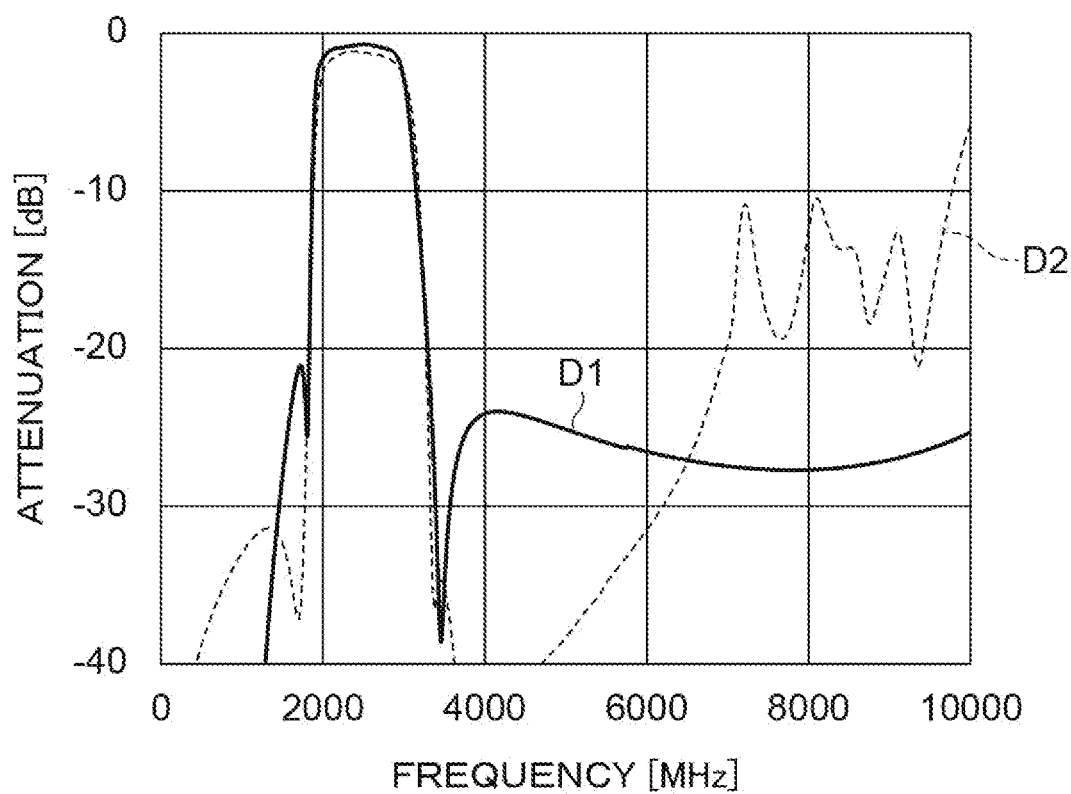
FIG. 7 is a diagram illustrating the characteristics of the multilayer filter.

FIG. 7 illustrates the characteristics of a multilayer filter with balanced-balanced characteristics. In FIG. 7, data D1 indicates the characteristics of the multilayer filter 1. Data D2 indicates the characteristics of a conventional multilayer filter with balanced-balanced characteristics. As illustrated in FIG. 7, in the data D1, spurious is suppressed at 7000 to 10000 MHz compared with the data D2.

Figure 8:
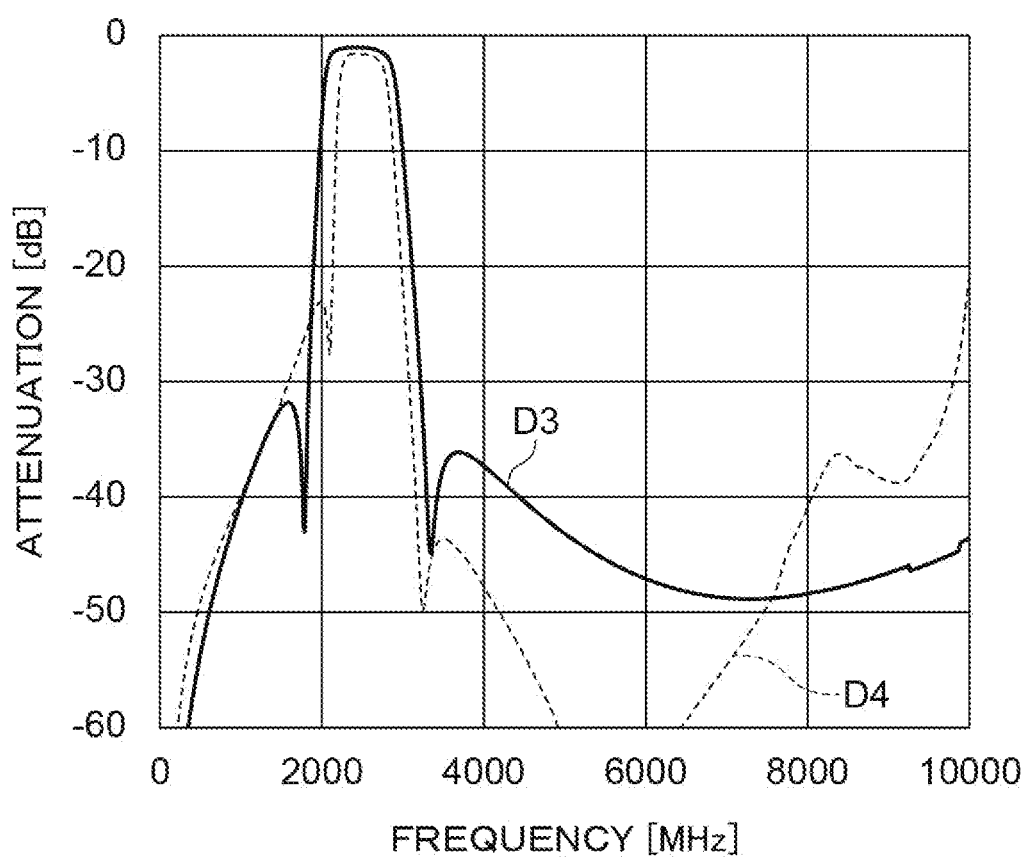
FIG. 8 is a diagram illustrating the characteristics of the multilayer filter.

FIG. 8 illustrates the characteristics of a multilayer filter with unbalanced-balanced characteristics. In FIG. 8, data D3 indicates the characteristics of the multilayer filter 1A. Data D4 indicates the characteristics of a conventional multilayer filter with unbalanced-balanced characteristics. As illustrated in FIG. 8, in the data D3, spurious is suppressed at 8000 to 10000 MHz compared with the data D4.

In the multilayer filter 1, the inductor conductor 44 includes the conductor layer 77 and a plurality of vias 79. The conductor layer 77 extends in a direction crossing the stacking direction. The plurality of vias 79 are electrically connected to the conductor layer 77. The plurality of vias 79 are arranged in the stacking direction. According to this configuration, in a compact multilayer filter, the length of the conductive path in the inductor conductor 44 can be secured. The multilayer filter 1A also has a similar configuration.

In the multilayer filter 1, the conductor layer 77 is included in the dielectric layer 7a. In this case, desired spurious can be adjusted more easily. The multilayer filter 1A also has a similar configuration.

In the multilayer filter 1, half or more of the plurality of vias 79 are included in the dielectric layer 7a. In this case, desired spurious can be adjusted more easily. The multilayer filter 1A also has a similar configuration.

In the multilayer filter 1A, the electrical circuit 21A includes the inductor conductor 41 and the capacitor conductors 91a to 91c. The inductor conductor 41 of the electrical circuit 21A has the ends 41a and 41b. The capacitor conductors 91a to 91c are connected to the end 41a. The end 41b may be grounded. In this case, in the multilayer filter 1A having unbalanced-balanced characteristics, high-frequency spurious can be reduced.

In the multilayer filter 1A, the capacitor conductors 91a to 91c may be included in the dielectric layer 7b. In this case, desired spurious can be adjusted more easily.

In the multilayer filter 1, the electrical circuit 21 includes the inductor conductor 41, the capacitor conductors 51a, 51c, and 51e, and the capacitor conductors 51b, 51d, and 51f. The inductor conductor 41 has the ends 41a and 41b. The capacitor conductors 51a, 51c, and 51e are connected to the end 41a. The capacitor conductors 51b, 51d, and 51f are connected to the end 41b. In this case, in the multilayer filter 1 having balanced-balanced characteristics, high-frequency spurious can be reduced.

In the multilayer filter 1, the capacitor conductors 51a, 51c, and 51e and the capacitor conductors 51b, 51d, and 51f are included in the dielectric layer 7b. In this case, desired spurious can be adjusted more easily.

In the multilayer filter 1, the electrical circuit 21 and the electrical circuit 24 have configurations that are mirror-symmetrical to each other. In this case, it is possible to realize a multilayer filter in which variations are suppressed and a desired impedance is secured.

In the multilayer filter 1, the plurality of dielectric layers 7 include the plurality of dielectric layers 7a and 7c. The dielectric layer 7b is interposed between the plurality of dielectric layers 7a and 7c. The multilayer body 3 has the main surface 2b as a mounting surface and the main surface 2a as a facing surface. The main surface 2a faces the main surface 2b in the stacking direction of the plurality of dielectric layers 7. The dielectric layer 7b is closer to the main surface 2b than to the main surface 2a. In this case, the stray capacitance can be reduced in a state in which the multilayer filter 1 is mounted. The inductor conductors 41 to 44 are arranged at locations relatively far from the ground. As a result, the Q value can be secured.

The coil axes AX2 and AX3 of the inductor conductors 41 and 44 and the coil axis AX1 of the inductor conductors 42 and 43 cross each other. In this case, magnetic coupling between the inductor conductors 41 and 42 and the inductor conductors 43 and 44 is suppressed.

While the embodiment of the present invention and its modification example have been described above, the present invention is not necessarily limited to the embodiment and its modification example described above, and various changes can be made without departing from the scope of the present invention.

For example, in the embodiment and its modification example described above, the electrical circuits 21 and 24 may be coils wound once or three or more times around the coil axes AX2 and AX3. The electrical circuits 22 and 23 may be coils wound multiple times around the coil axis AX1.

As can be understood from the description of the above embodiment, this specification includes disclosure of the aspects described below.

(Note 1)
A multilayer filter, including:
a multilayer body in which a plurality of dielectric layers are stacked; and
a conductor unit provided inside the multilayer body,
wherein the conductor unit includes an input/output portion and first and second resonant circuits arranged in a direction crossing a stacking direction of the plurality of dielectric layers, and connected to the input/output portion,
the input/output portion includes an input/output port group including an unbalanced port and a pair of balanced ports or an input/output port group including two pairs of balanced ports,
the second resonant circuit includes an inductor conductor having first and second ends, a first capacitor conductor connected to the first end, and a second capacitor conductor connected to the second end,
the plurality of dielectric layers include a first dielectric layer and a second dielectric layer having a dielectric constant lower than that of the first dielectric layer,
the first and second capacitor conductors are provided in the first dielectric layer, and
at least a part of the inductor conductor is provided in the second dielectric layer.

(Note 2)
The multilayer filter according to Note 1,
wherein the first resonant circuit includes an inductor conductor having third and fourth ends and a third capacitor conductor connected to the third end, and
the fourth end is grounded.

(Note 3)
The multilayer filter according to Note 2,
wherein the third capacitor conductor is provided in the first dielectric layer.

(Note 4)
The multilayer filter according to Note 1,
wherein the first resonant circuit includes an inductor conductor having third and fourth ends, a third capacitor conductor connected to the third end, and a fourth capacitor conductor connected to the fourth end.

(Note 5)
The multilayer filter according to Note 4,
wherein the third capacitor conductor and the fourth capacitor conductor are provided in the first dielectric layer.

(Note 6)
The multilayer filter according to Note 4 or 5,
wherein the first resonant circuit and the second resonant circuit have configurations mirror-symmetrical to each other.

(Note 7)
The multilayer filter according to any one of Notes 1 to 6,
wherein the inductor conductor includes a conductor layer extending in a direction crossing the stacking direction and a plurality of vias electrically connected to the conductor layer and arranged in the stacking direction.

(Note 8)
The multilayer filter according to Note 7,
wherein the conductor layer is included in the second dielectric layer.

(Note 9)
The multilayer filter according to Note 7 or 8,
wherein half or more of the plurality of vias are included in the second dielectric layer.

(Note 10)
The multilayer filter according to any one of Notes 1 to 9,
wherein the plurality of dielectric layers include a plurality of the second dielectric layers,
the first dielectric layer is interposed between the plurality of second dielectric layers,
the multilayer body has a mounting surface and a facing surface facing the mounting surface in the stacking direction of the plurality of dielectric layers, and
the first dielectric layer is closer to the mounting surface than to the facing surface.

What is claimed is:

1. A multilayer filter, comprising:
a multilayer body in which a plurality of dielectric layers are stacked; and
a conductor unit provided inside the multilayer body,
wherein the conductor unit includes an input/output portion and first and second resonant circuits arranged in a direction crossing a stacking direction of the plurality of dielectric layers and connected to the input/output portion,
the input/output portion includes an input/output port group including an unbalanced port and a pair of balanced ports or an input/output port group including two pairs of balanced ports,
the second resonant circuit includes an inductor conductor having first and second ends, a first capacitor conductor connected to the first end, and a second capacitor conductor connected to the second end,
the plurality of dielectric layers include a first dielectric layer and a second dielectric layer having a dielectric constant lower than that of the first dielectric layer,
the first and second capacitor conductors are provided in the first dielectric layer, and
at least a part of the inductor conductor is provided in the second dielectric layer.

2. The multilayer filter according to claim 1,
wherein the first resonant circuit includes an inductor conductor having third and fourth ends and a third capacitor conductor connected to the third end, and
the fourth end is grounded.

3. The multilayer filter according to claim 2,
wherein the third capacitor conductor is provided in the first dielectric layer.

4. The multilayer filter according to claim 1,
wherein the first resonant circuit includes an inductor conductor having third and fourth ends, a third capacitor conductor connected to the third end, and a fourth capacitor conductor connected to the fourth end.

5. The multilayer filter according to claim 4,
wherein the third capacitor conductor and the fourth capacitor conductor are provided in the first dielectric layer.

6. The multilayer filter according to claim 4,
wherein the first resonant circuit and the second resonant circuit have configurations mirror-symmetrical to each other.

7. The multilayer filter according to claim 1,
wherein the inductor conductor includes a conductor layer extending in a direction crossing the stacking direction, and a plurality of vias electrically connected to the conductor layer and arranged in the stacking direction.

8. The multilayer filter according to claim 7,
wherein the conductor layer is included in the second dielectric layer.

9. The multilayer filter according to claim 7,
wherein half or more of the plurality of vias are included in the second dielectric layer.

10. The multilayer filter according to claim 1,
wherein the plurality of dielectric layers include a plurality of the second dielectric layers,
the first dielectric layer is interposed between the plurality of second dielectric layers,
the multilayer body has a mounting surface and a facing surface facing the mounting surface in the stacking direction of the plurality of dielectric layers, and
the first dielectric layer is closer to the mounting surface than to the facing surface.

* * * * *